United States Patent [19]
Ang et al.

[11] Patent Number: 5,325,335
[45] Date of Patent: Jun. 28, 1994

[54] MEMORIES AND AMPLIFIERS SUITABLE FOR LOW VOLTAGE POWER SUPPLIES

[75] Inventors: Michael A. Ang, Santa Clara; David J. Pilling, Los Altos Hills, both of Calif.

[73] Assignee: Integrated Device Technology, Inc., Santa Clara, Calif.

[21] Appl. No.: 894,414

[22] Filed: Jun. 5, 1992

Related U.S. Application Data

[63] Continuation-in-part of Ser. No. 709,923, May 30, 1991, and a continuation-in-part of Ser. No. 709,924, May 30, 1991.

[51] Int. Cl.$^5$ .................................................. G11C 11/40
[52] U.S. Cl. ...................................... 365/205; 365/203; 365/208
[58] Field of Search ............... 365/203, 204, 205, 206, 365/207, 208, 202; 307/530

[56] References Cited

U.S. PATENT DOCUMENTS

| | | | |
|---|---|---|---|
| 4,764,901 | 8/1988 | Sakurai | 365/203 |
| 4,804,871 | 2/1989 | Walkers, Jr. | 365/203 |
| 5,007,023 | 4/1991 | Kim et al. | 365/203 |
| 5,058,072 | 10/1991 | Kashimura | 365/203 |

OTHER PUBLICATIONS

*Dense Sense Amplifier/Latch Combination*, IBM Technical Disclosure Bulletin, vol. 29, No. 5, Oct., 1986, pp. 2160-2161.

*Primary Examiner*—Eugene R. LaRoche
*Assistant Examiner*—Vu A. Le
*Attorney, Agent, or Firm*—Skjerven, Morrill, MacPherson, Franklin and Friel

[57] ABSTRACT

A sense amplifier for a static memory includes two pull-up transistors. The gate of each transistor is coupled to the drain of the other transistor. A circuitry is provided for precharging the drains of both pull-up transistors to a selected voltage such that by the start of the tracking stage of the amplifier, both pull-up transistors are off. If the tracking stage is long enough, one pull-up transistor turns on while the other one remains off, so that before the start of the sensing stage both pull-up transistors reach their final ON/OFF states. Hence the amplifier is fast and power efficient. The memory bit lines are precharged to VCC before the tracking stage, improving the read-disturb immunity and hence allowing a wider range of voltages on the bit lines and the sense amplifier inputs. The noise immunity and tolerance to temperature process variations are improved as a result. The high noise immunity make the amplifier and the memory suitable for integration with noisy circuits such as CPUs. High speed, high power efficiency, high noise immunity, high tolerance to temperature and process variations and high permissible range of bit line voltages make the memory and the amplifier suitable for low-voltage power supplies such as VCC=3.0 V supplies used in lap-top, notebook, sub-note book, and hand-held computers.

11 Claims, 6 Drawing Sheets

MEMORIES AND AMPLIFIERS SUITABLE FOR LOW VOLTAGE POWER SUPPLIES

CROSS-REFERENCE TO RELATED APPLICATIONS

This application is a continuation-in-part of the U.S. patent application Ser. No. 07/709,923 filed May 30, 1991 by M. A. Ang and D. J. Pilling, and of U.S. patent application Ser. No. 07/709,924 filed May 30, 1991 by M. A. Ang and D. J. Pilling, both assigned to the same assignee as this application. The disclosures of the aforementioned patent applications Ser. Nos. 07/709,923 and 07/709,924 are hereby incorporated herein by reference.

BACKGROUND OF THE INVENTION

The present invention relates to electric devices, and more particularly to memories and amplifiers.

The popularity of battery-powered electronic devices such as laptop, notebook, sub-notebook and hand-held computers increased the need for circuitry that operates efficiently at lower power supply voltages. A typical laptop computer is powered by a 3.0 V power supply as compared to 5.0 V power supplies used in some older non-portable computers. Older memories and sense amplifiers developed for use with the 5.0 V power supplies are often inadequate for use with lower voltage power supplies as illustrated by the following example.

FIG. 1 is a circuit diagram of one column of an array of four-transistor memory cells of a prior art static random access memory ("SRAM"). Such a memory is described in the aforementioned U.S. patent application Ser. No. 07/709,924. For simplicity, only two memory cells 110A and 110B are shown in FIG. 1, and only the cell 110A is shown in detail. Memory cell 110A includes pull-down transistors 116, 122, pass transistors 130, 134, and load resistors 136, 138. The memory cell is powered by voltage VCC=5.0 V. Voltage VSS is ground (0.0 V). The voltages at nodes N, $\overline{N}$ at the drains of respective pull-down transistors 116, 122 determine the state of the memory cell (binary 0 or 1). In one state, the voltage at node N is high (near VCC) and the voltage at node $\overline{N}$ is low (near 0.0 V). i In the other state, node $\overline{N}$ is high and node N is low.

When memory cell 110A is being read, word line WL-A is driven high to turn on pass transistors 130, 134 and thereby to connect nodes N, $\overline{N}$ to respective bit lines BL, $\overline{BL}$. Line 140 is driven high to turn on Y-decode transistors 142, 144 and thus to connect bit lines BL, $\overline{BL}$ to respective inputs 150a, 150b of sense amplifier 150. Sense amplifier 150 tracks the bit line voltages. Word line WL-A and line 140 remain high during tracking. Sense amplifier 150 produces on output lead 170 a signal indicative of the difference between the voltages on bit lines BL, $\overline{BL}$ and hence indicative of the state of memory cell 110A.

Equalizing transistor 180 resistively shorts bit lines BL and $\overline{BL}$ to each other to prevent the difference between the bit line voltages from exceeding a predetermined value, 0.3 V in some embodiments. This is done to prevent accidental toggling (and hence overwriting) of the memory cells as explained more fully in the aforementioned patent application Ser. No. 07/709,924.

Bit lines BL, $\overline{BL}$ are charged statically by respective transistors 172, 174. Between reading operations, transistors 172 and 174 bias the respective bit lines at about VCC/2=2.5 V. When memory cell 110A is being read, transistors 172, 174 remain on preventing the bit line voltages from decreasing below a predetermined value, 2.2 V in some embodiments. This is done to prevent accidental toggling of the memory cell. Namely, during reading, the memory cell pulls down both bit lines BL and $\overline{BL}$ and not only the bit line connected to the low voltage node N or $\overline{N}$, because equalizing transistor 180 resistively shorts the bit lines as described above. In addition, both bit lines are pulled down by charge leakage. If the voltages on both bit lines become low, below 2.2 V in some embodiments, the conductance of pull-down transistors 116, 122 becomes so low that the memory cell may toggle (i.e. switch states). By remaining on during reading, transistors 172, 174 prevent such toggling. Between reading operations, transistors 172, 174 keep the bit lines at 2.5 V in order to ensure the 2.5 V bit line voltage at the start of each reading operation and thus to prevent a low voltage caused by the previous operation or by the charge leakage from toggling a memory cell.

FIG. 2 is a circuit diagram of sense amplifier 150 which is powered by voltage VCC=5.0 V. Matched pull-up PMOS transistors 202, 203, connected as a current mirror, provide current to respective nodes 204, 205. Matched pull-down NMOS transistors 206, 207 sink current from respective nodes 204, 205. NMOS transistor 208, whose gate is connected to a constant voltage VREF, is a current source which sets the total current passing through transistors 206, 207.

Inputs 150a, 150b of amplifier 150 are connected to the gates of respective transistors 206, 207 so as to control the currents through the transistors. The balance of the currents through transistors 206, 207 determines the output voltage DOUT on the output lead 170 which is connected to node 205. If inputs 150a, 150b are at equal voltages, the currents through transistors 206, 207 are equal, and the voltages at nodes 204, 205 are also equal. If the voltage on input 150a is higher than the voltage on input 150b, transistor 206 sinks more current than transistor 207. The voltage on node 204 goes down, the voltage on node 205 goes up, and increased DOUT indicates that the voltage on input 150a is above the voltage on input 150b.

Similarly, if input 150a is lower than input 150b, transistor 207 sinks more current than transistor 206. Node 205 is pulled down, and decreased DOUT indicates that the voltage on input 150b is above the voltage on input 150a.

If VCC is reduced to 3.0 V as in laptop computers, the currents through transistors 206, 207 decrease, and sense amplifier 150 becomes slower since it takes longer to pull down node 204 or 205. The speed of the sense amplifier could be increased by increasing the power consumption, but increased power consumption is undesirable in general and especially so in battery-powered laptop computers.

Further, as is known in the art, transistors 206, 207 must be in saturation to maximize the gain of the sense amplifier. The saturation requirement restricts the range of permissible voltages on inputs 150a, 150b. When VCC decreases to 3.0 V, the range of permissible voltages becomes restricted further. The difference between the currents at nodes 204, 205 becomes therefore smaller, and the sense amplifier becomes slower because it takes longer to transform the smaller current difference into an output level DOUT indicative of the state of the memory cell. Further, the smaller difference between the voltages on inputs 150a, 150b is easier to upset by noise and by temperature and process variations. In particular, temperature and process variations may affect the memory so as to further reduce the difference between the voltages on inputs 150a, 105b causing the voltage difference to be unnoticeable to sense amplifier 150 at VCC=3.0 V. Process variations may also affect sense amplifier 150 by, for example, causing a mismatch of transistors 206, 207 so that sense amplifier 150 would pull down a wrong one of nodes 204, 205 when the voltage difference between inputs 150a, 150b is small as it is at VCC=3.0 V. Thus the noise immunity of the sense amplifier and the tolerance to temperature and process variations are inadequate for 3.0 V power supply systems.

There is a need therefore for faster and more power-efficient memories and sense amplifiers which have improved noise immunity and improved tolerance to temperature and process variations and which can operate at low power supply voltages such as used in laptop, notebook, sub-notebook and hand-held computers.

SUMMARY OF THE INVENTION

The memories and the amplifiers of the present invention have in some embodiments a high speed, high power efficiency, high noise immunity and high tolerance to temperature and process variations. The memories and the amplifiers are suitable for both 5.0 V and 3.0 V power supply systems. In particular, the memories and the amplifiers are suitable for laptop, notebook, sub-notebook and hand-held computers.

A sense amplifier in accordance with the invention has in some embodiments two nodes for receiving two complementary signals from the bit lines. The two nodes are connected to VCC by pull-up devices, such as transistors. The impedance of the pull-up devices depends on the node voltages. Uniquely, at the start of the reading operation, the two nodes are precharged so as to turn off the pull-up devices. One of the devices will remain off to the end of the reading operation and thus will not interfere with pulling the respective node down.

More particularly, at the start of the reading operation, the sense amplifier nodes and the bit lines are precharged to VCC. Then the bit lines sense the memory cell, and the nodes track the bit line voltages. One of the bit lines, say, BL, is pulled down by the cell while the other bit line remains at VCC. Accordingly, the node connected to BL, say, node N1, is pulled down while the other node, say, node N2, remains at VCC. Nodes N1 and N2 control the pull-up devices so that when node N2 is at VCC, the device connected to node N1 remains off and does not interfere with pulling node N1 down. Consequently, the amplifier is fast and power efficient. Further, as explained below, the voltage difference between nodes N1 and N2 is less restricted than the voltage difference between amplifier inputs in the prior art. Hence the amplifier has a high noise immunity and a high tolerance to temperature and process variations.

Other features and advantages of the invention are described below. The invention is defined by the appended claims.

DESCRIPTION OF THE PREFERRED EMBODIMENTS

Figure 3:
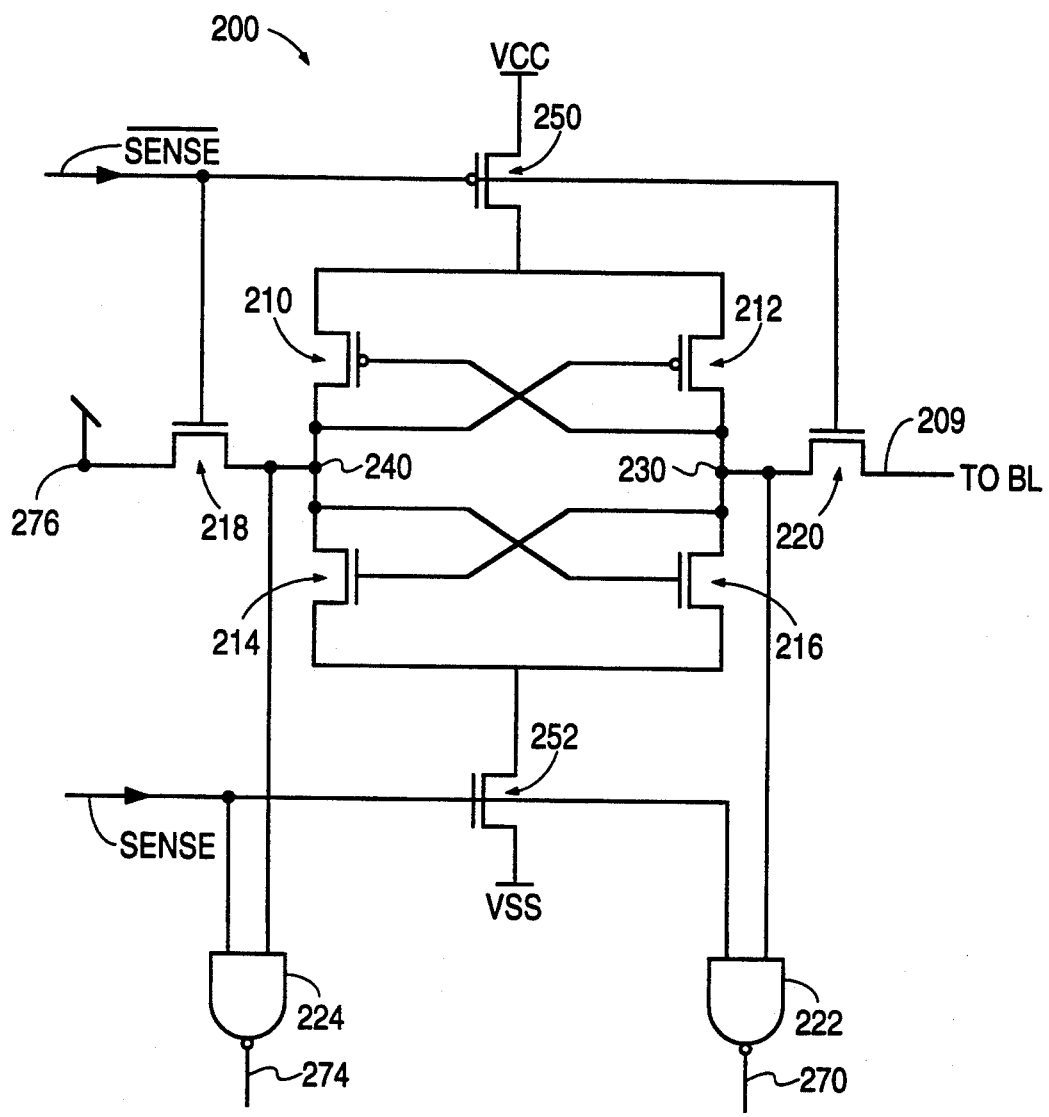
FIG. 3 is a circuit diagram of another prior art sense amplifier.

FIG. 3 is a circuit diagram of another prior art sense amplifier 200 operated at VCC=5.0 V. The amplifier is described in the aforementioned patent application Ser. No. 07/709,923. Bit lines BL, $\overline{BL}$ are connected to amplifier input 209 through a pre-amplifier (not shown), as-described in the patent application Ser. No. 7/709,923. The pre-amplifier provides on input 209 a signal either above or below 2.5 V depending on the bit line voltage difference. Pull-up PMOS transistors 210, 212, pull-down NMOS transistors 214, 216, and NMOS transistors 218, 220 are connected as in a six-transistor memory cell. Six-transistor memory cells are described generally in C. A. Holt, *Electronic Circuits* (John Wiley & Sons, 1978) incorporated herein by reference, pages 293, 294. NAND gates 222 and 224 connect respective nodes 230 and 240, which are the drains of respective transistors 212 and 210, to respective complementary output leads 270 and 274.

Each reading operation includes a tracking stage and a sensing stage. During the tracking stage, signal SENSE in sense amplifier 200 is low, and accordingly $\overline{SENSE}$ is high. Transistors 218 and 220 are on. Node 230 tracks the voltage on input 209 and thus charges to a value of about 2.2 V or 2.8 V, depending on the state of the memory cell being read. Terminal 276 is biased statically at 2.5 V, so node 240 charges to 2.5 V. Transistors 250 and 252 are off isolating voltages VCC and VSS from nodes 230 and 240.

Figure 1:
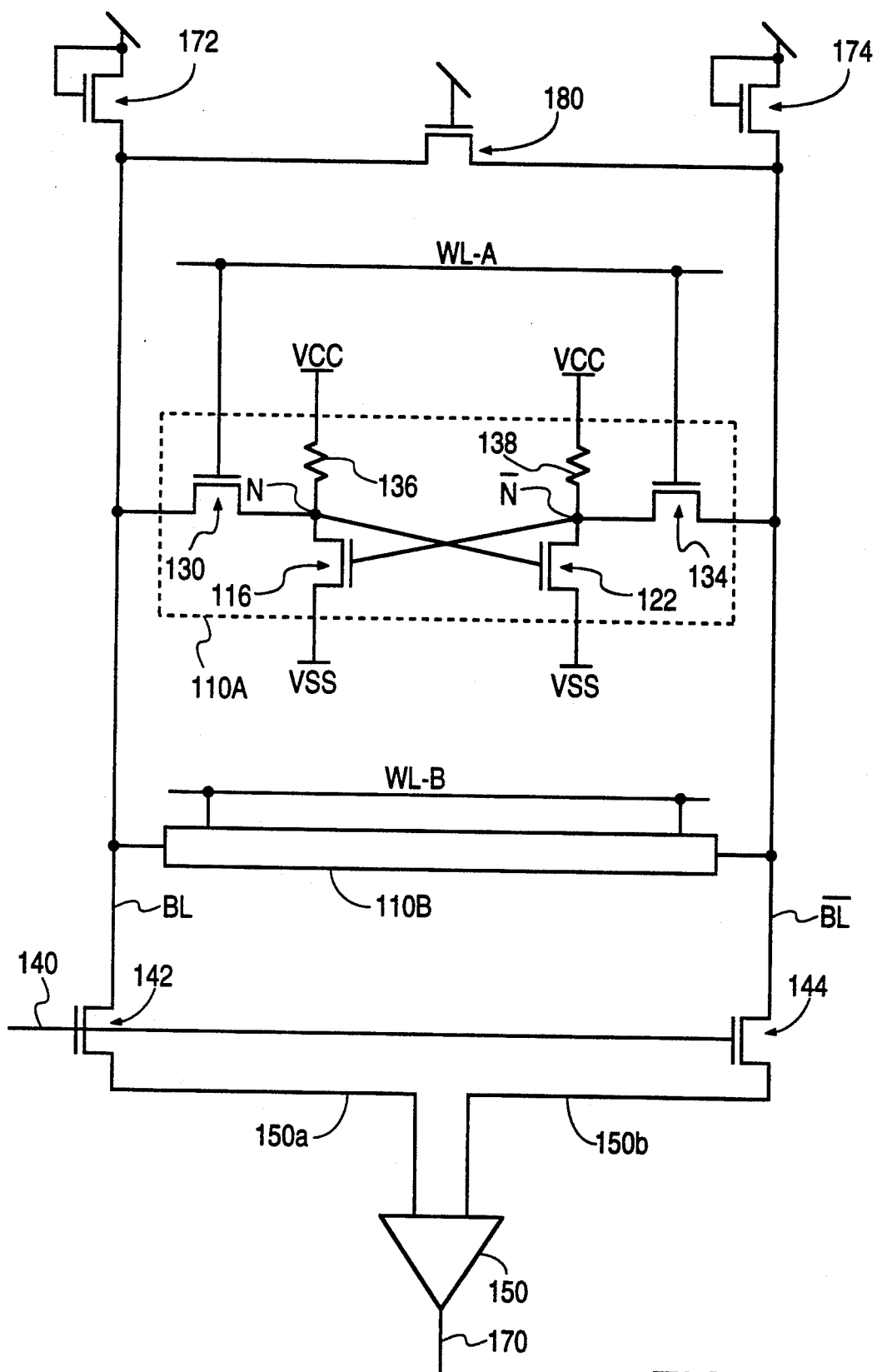
FIG. 1 is a circuit diagram of a portion of a prior art memory.
Figure 2:
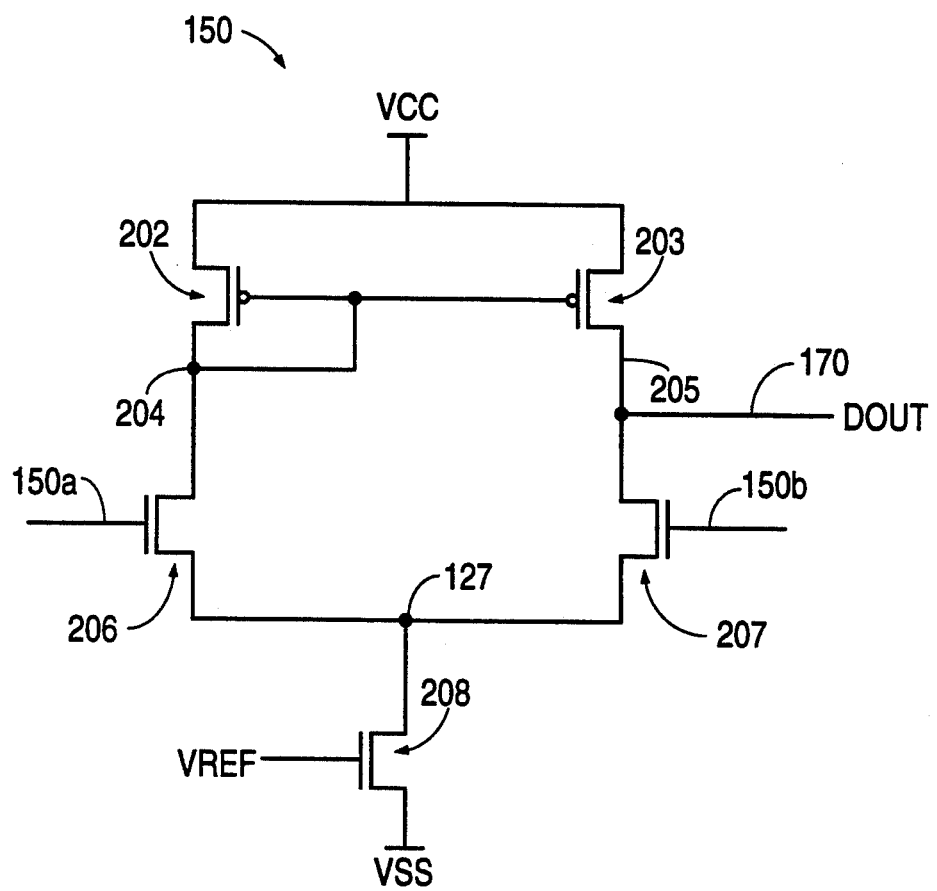
FIG. 2 is a circuit diagram of a prior art sense amplifier.

The word line (such as word line WL-A of cell 110A in FIG. 1) remains high through the tracking stage.

To start the sensing stage, signal SENSE is driven high, and $\overline{SENSE}$ is driven low. Transistors 218 and 220 turn off, and transistors 250 and 252 turn on. Both pull-up transistors 210 and 212 turn on because the voltages at nodes 230, 240 differ from VCC by more than |VTP| where VTP is the threshold voltage of transistors 210, 212—node 230 is between 2.2 V and 2.8 V right after SENSE becomes high, node 240 is at 2.5 V, and VTP is about −0.7 V. The absolute value of the threshold voltage VTP is kept at a relatively low value of 0.7 V in order to increase the gain of transistors 210, 212, that is, in order to increase the current through transistors 210, 212 at given source, drain and gate voltages.

When signal SENSE first becomes high, pull-down transistors 214, 216 turn on also. If the voltage on node 230 is below the voltage on node 240, pull-down transistor 216 overcomes pull-up transistor 212 and pulls node 230 down to 0.0 V. Transistor 214 turns off. Node 240 is pulled up to VCC, turning off transistor 212.

Conversely, if the voltage on node 240 is below the voltage on node 230, pull-down transistor 214 overcomes pull-up transistor 210 and pulls node 240 down to 0.0 V. Transistor 216 turns off. Node 230 is pulled up to VCC, turning off transistor 210.

In both cases, at the beginning of the sensing stage, pull-up transistors 212 and 210 are both on thereby interfering with pulling the respective node 230 or 240 down. This interference slows the sense amplifier and increases the power consumption, making the sense amplifier poorly suited for 3.0 V power supply systems.

Further, the transistor switching in the sense amplifier generates much noise during the sensing stage, and the noise can upset the voltage difference between nodes 230, 240, resulting in a wrong memory reading. Namely, at the beginning of the sensing stage, all the transistors of sense amplifier 200 switch states—transistors 210, 212, 214, 216, 250, 252 turn on, and transistors 218, 220 turn off. At the beginning of the sensing stage the voltage difference between nodes 230, 240 is still small, and the noise generated by the transistor switching, alone or in combination with a small amount of external noise, can upset the voltage difference. If the voltage difference is upset, the regenerative effect will amplify the upset voltage difference, and hence the result of the memory reading operation will be wrong even if the noise subsides before the end of the sensing stage. Further, during the sensing stage, one of the transistors 210, 212 and one of the transistors 214, 216 turn off generating additional noise. It is desirable to reduce the noise generated in the sensing stage as this will make the sense amplifier more reliable and, in particular, more immune to a noise external to the amplifier.

The noise immunity and the tolerance to temperature and process variations are restricted by the range of voltages on input 209 which range is in turn restricted by the maximum voltage difference between bit lines BL, $\overline{BL}$. The voltage difference between the bit lines is restricted by equalizing transistor 180 (FIG. 1) in order to improve the read-disturb immunity of the memory, i.e., to reduce the chance of accidental toggling of a memory cell as described above.

Figure 4:
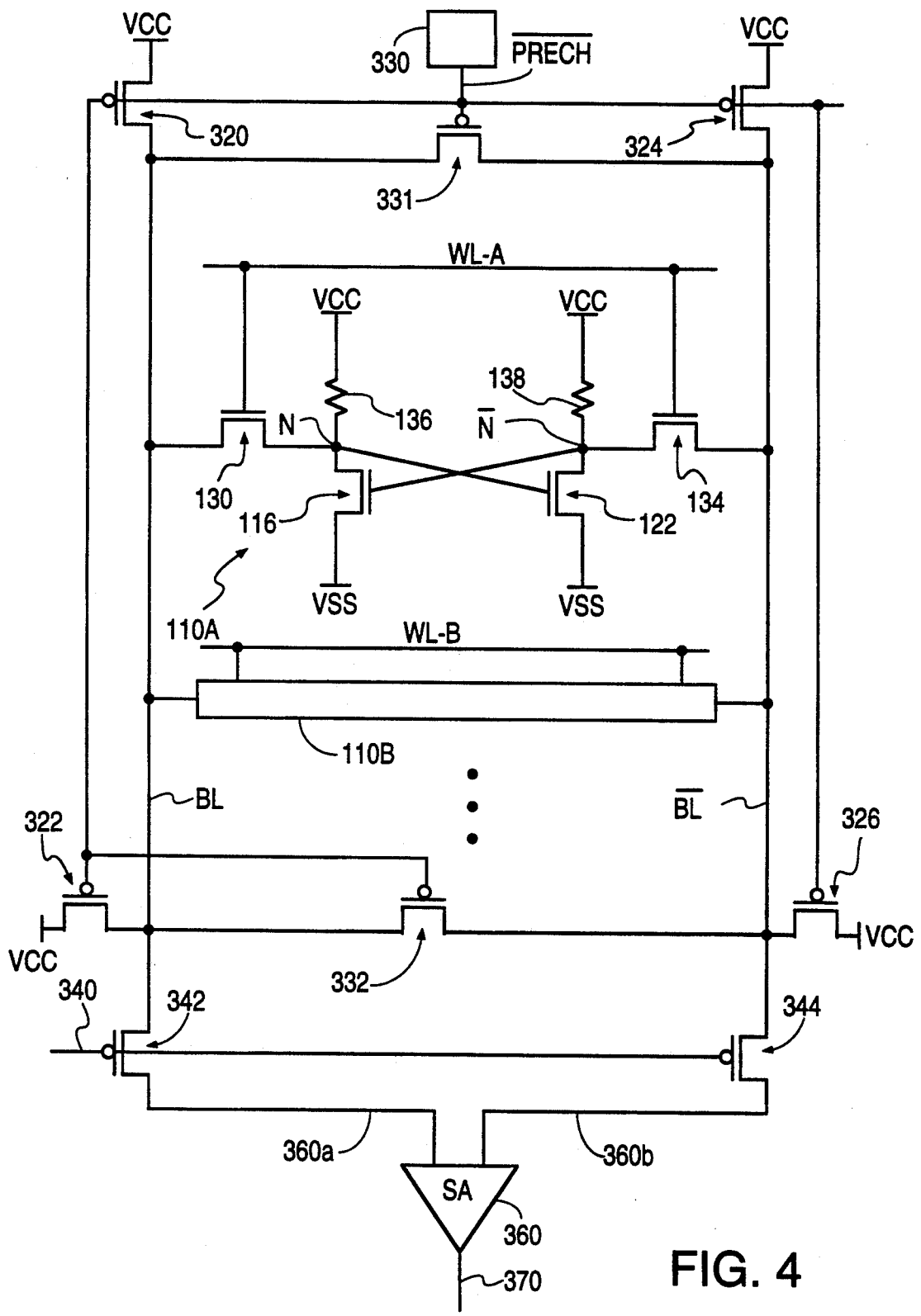
FIG. 4 is a circuit diagram of a portion of a memory of the present invention.
Figure 5:
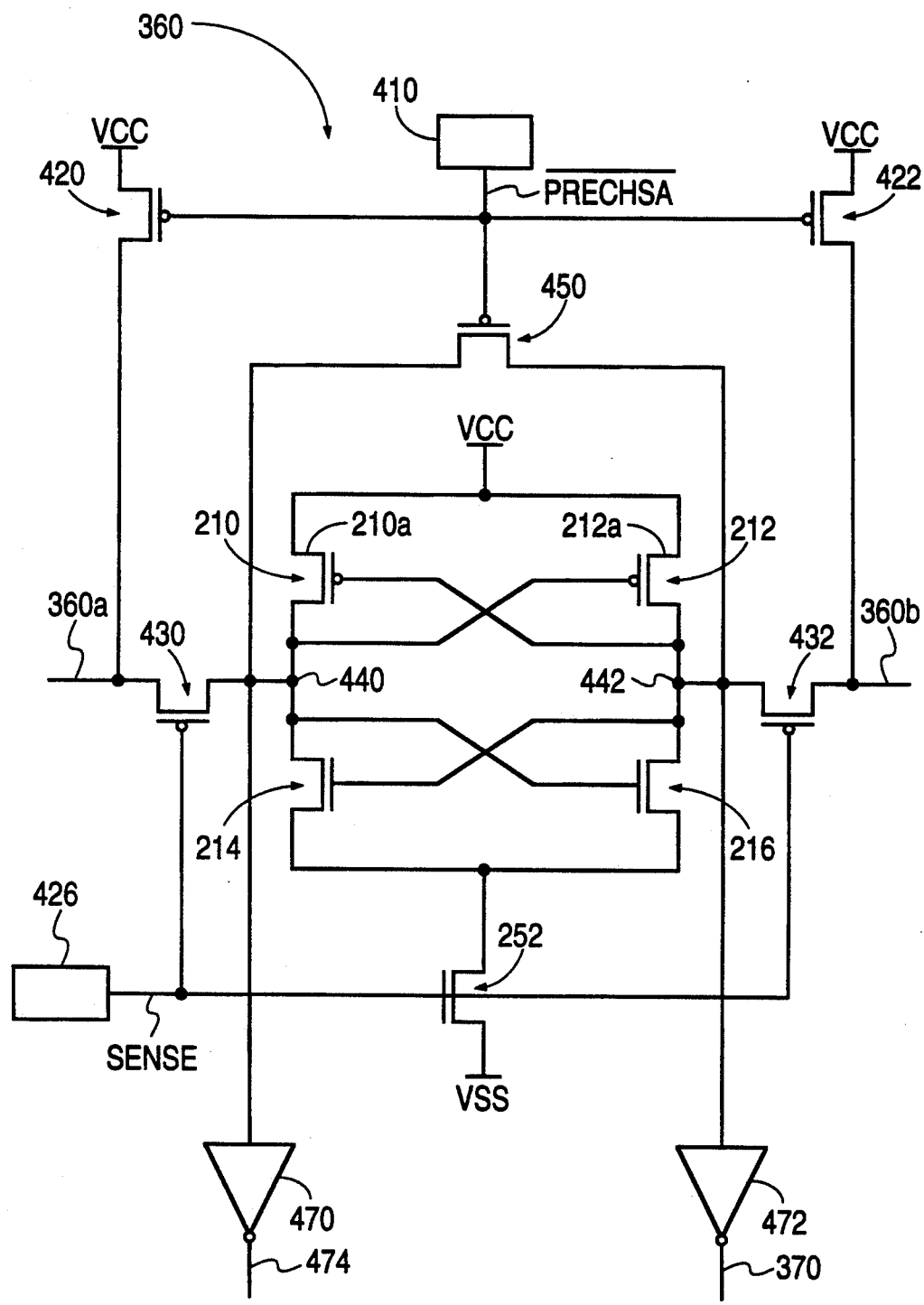
FIG. 5 is a circuit diagram of a sense amplifier of the present invention.

FIG. 4 shows a circuit diagram of one column of a static random access memory (SRAM) suitable for 3.0 V power supply systems. FIG. 5 shows a circuit diagram of the sense amplifier of this invention used in the memory of FIG. 4. As explained below, the memory and the sense amplifier of FIGS. 4 and 5 have a high speed, high power efficiency, and high noise immunity, and high tolerance to temperature and process variations.

The memory of FIG. 4 contains an array of four-transistor memory cells such as cells 110A, 110B. Each cell has the same structure as in FIG. 1. However, the memory of FIG. 4 does not use static charging of the bit lines. Transistors 320, 322, 324 and 326 charge the bit lines only during one stage ("precharge stage") of the reading operation.

Figure 6:
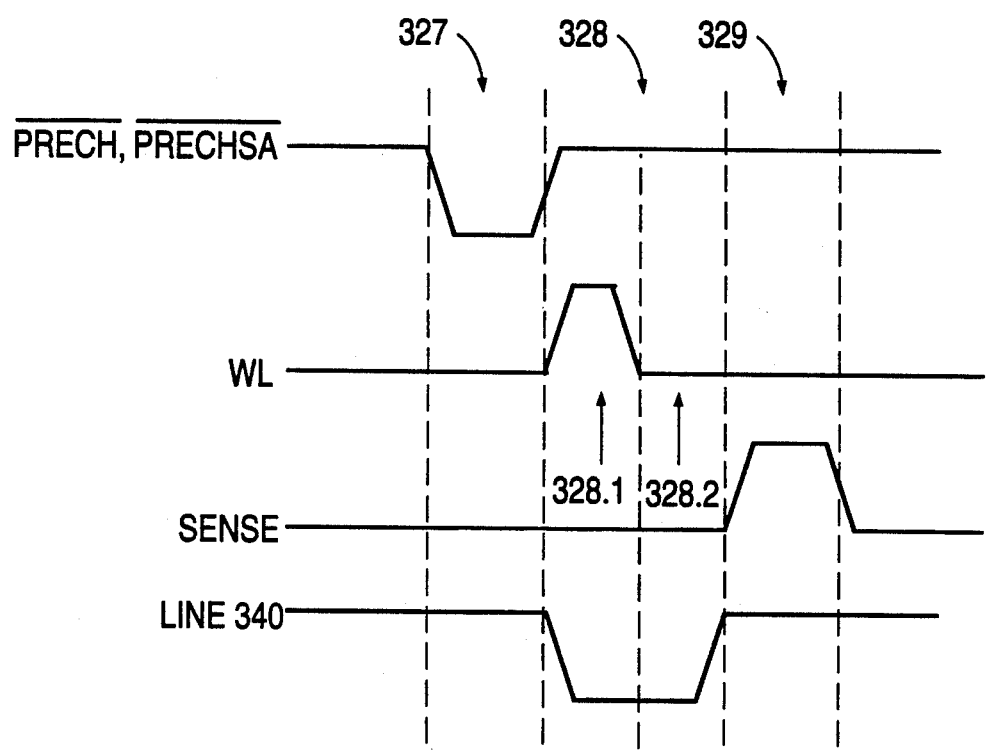
FIG. 6 is a timing diagram of some signals of FIGS. 4 and 5.

More particularly, a reading operation includes precharge stage 327 (FIG. 6), tracking stage 328, and sensing stage 329. During precharge stage 327, circuitry 330 built from conventional logic drives signal $\overline{PRECH}$ low. PMOS transistors 320, 322, 324, 326 turn on and precharge bit lines BL and $\overline{BL}$ to VCC. Equalizing PMOS transistors 321, 332 also turn on equalizing the bit lines and speeding up precharge.

Precharging the bit lines BL, $\overline{BL}$ to VCC rather than VCC/2 improves the read-disturb immunity of the memory as explained in the aforementioned patent application Ser. No. 07/709,924. The improved read-disturb immunity makes the static (i.e., clock-independent) charging of the bit lines unnecessary, and hence transistors 320, 322, 324, and 326 are turned off during the tracking and sensing stages and, in fact, at all times except the precharge stage. The improved read-disturb immunity also makes unnecessary the bit line equalization during the tracking and sensing stages. Hence equalizing transistors 331, 332 are also turned off at all times except the precharge stage.

The tracking and sensing stages will be illustrated on the example of reading the memory cell 110A. During tracking stage 328 (FIG. 6), $\overline{PRECH}$ is high. Transistors 320, 322, 324, 326, 331 and 332 are therefore off. During an initial period 328.1 of tracking stage 328, the row address decoder ("X-decoder", not shown) drives word line WL-A to VCC. Pass transistors 130 and 134 therefore turn on. Memory cell 110A pulls the voltage on bit line BL or $\overline{BL}$ down. It will be assumed below for the sake of illustration that the memory cell 110A pulls down bit line BL. The column decoder ("Y-decoder", not shown) drives line 340 low during entire stage 328. Y-decode PMOS transistors 342 and 344 turn on, connecting bit lines BL and $\overline{BL}$ to respective inputs 360a and 360b of sense amplifier 360. Sense amplifier 360 tracks the bit line voltages.

At the end of period 328.1 of tracking stage 328, word line WL-A is driven low isolating nodes N and $\overline{N}$ from bit lines BL and $\overline{BL}$. By the end of period 328.1, the voltage difference on the bit lines reaches a desired value suitable for amplification by sense amplifier 360. Word line WL-A is low during the remaining period 328.2 of tracking stage 328 so as to prevent the lower-voltage bit line BL from being pulled unnecessarily further down by memory cell 110A. Preventing bit line BL from being pulled unnecessarily further down saves power and increases the speed at the bit line precharge during the next reading operation. Further, since word line WL-A is low, nodes N and $\overline{N}$ are isolated from noise on the bit lines, and hence the noise immunity is improved. During period 328.2, sense amplifier 360 continues tracking the bit line voltages.

Word line WL-A can be driven low during period 328.2 because equalizing transistors 331, 332 are off and they will not erase the voltage difference on the bit lines even if the system clock (not shown) is stopped or reduced in frequency. The clock is sometimes stopped or reduced in laptop, notebook, sub-notebook and handheld computers to save power. The memory operation then becomes suspended or slowed down, and the equalizing transistors, if on, could erase the voltage difference on the bit lines if the word line is driven low. In the memory of FIG. 4, however, equalizing transistors 331, 332 are turned off in the tracking stage because, as explained above, the memory has a high read-disturb immunity permitting a higher voltage difference on the bit lines.

Because bit lines BL and $\overline{BL}$ are precharged to VCC rather than VCC/2, the gain of pass transistor 130 is increased during period 328.1, and hence the speed at which bit line BL is pulled down by cell 110A is also increased. The memory speed is increased as a result.

In one embodiment, tracking stage 328 is about 3 ns long, and the period 328.1 is about 1.5 ns long, unless the clock is stopped or reduced. The voltage difference on bit lines BL and $\overline{BL}$ reaches 1.0 V by the end of period 328.1.

During sensing stage 329, sense amplifier 360 amplifies the bit line voltage difference and provides the amplified signal on output lead 370, as described below.

FIG. 5 shows a circuit diagram of one embodiment of sense amplifier 360. Amplifier 360 includes cross coupled pull-up PMOS transistors 210, 212 and cross coupled pull-down NMOS transistors 214, 216. Sources 210a and 212a of respective PMOS transistors 210 and 212 are connected directly to VCC. The sources of NMOS transistors 214, 216 are connected to the drain of NMOS transistor 252 whose source is connected to VSS (typically ground).

Circuitry 410 built from conventional logic generates a signal $\overline{\text{PRECHSA}}$. During precharge stage 327 (FIG. 6), signal $\overline{\text{PRECHSA}}$ is low. Signal SENSE generated by circuitry 426 built from conventional logic is also low. Low signals $\overline{\text{PRECHSA}}$ and SENSE cause nodes 440 and 442 at the drains of respective pull-up transistors 210 and 212 to be precharged to VCC if these nodes are not already at VCC. More particularly, low signal $\overline{\text{PRECHSA}}$ turns on PMOS transistors 420 and 422. Low signal SENSE turns on PMOS transistors 430 and 432. Node 440 precharges to VCC through transistors 420 and 430. Node 442 precharges to VCC through transistors 422 and 432.

Low signal $\overline{\text{PRECHSA}}$ turns on an equalizing PMOS transistor 450 shorting nodes 440 and 442 to each other. Consequently, nodes 440 and 442 are charged also through respective transistors 210 and 212 to voltage VCC−|VTP| where VTP is the threshold voltage of transistors 210 and 212 (−0.7 V in some embodiments, −1.0 V in some other embodiments). The additional precharge through transistors 210 and 212 makes the precharge operation fast. Further, equalizing transistor 450 helps minimize input offset error.

At the end of precharge stage 327, nodes 440 and 442 are at VCC, and hence pull-up transistors 210 and 212 are off.

During tracking stage 328, signal $\overline{\text{PRECHSA}}$ is high. Transistors 420, 422 are therefore off. The Y-decoder (not shown) connects inputs 360a, 360b to respective bit lines BL, $\overline{\text{BL}}$ (FIG. 5) as described above. Nodes 440, 442 track the voltages on respective bit lines BL, $\overline{\text{BL}}$ through respective transistors 430, 432. Bit line $\overline{\text{BL}}$ keeps node 442 high, so pull-up transistor 210 remains off. Node 440 is pulled down by the memory cell during the initial period 328.1 and, possibly, by the bit line charge leakage during entire tracking stage 328. At the end of period 328.1, the voltage at node 440 is typically higher than the voltage on bit line BL due to the RC delay. During period 328.2, node 440 continues tracking bit line BL. If period 328.1 or stage 328 are long enough, node 440 goes below VCC−|VTP| and turns on transistor 212. Thus before the start of sensing stage 329, i.e. before regeneration begins, pull-up transistors 210, 212 already reach their final ON/OFF states. Of note, bit line BL can go below VCC−|VTP| in some embodiments because of the high read-disturb immunity of the memory of FIG. 4 as explained above.

If node 440 goes below VCC−|VTP| during the tracking stage, transistor 212 turns on and restores the leaking charge, if any, on bit line $\overline{\text{BL}}$. This charge leakage restoration by sense amplifier 360 is power efficient. Indeed, the charge leakage is restored only on the higher-voltage bit line $\overline{\text{BL}}$. The charge leakage is not restored on the lower-voltage bit line BL and on the other bit lines (not shown) of the memory array. Power is saved thereby. Further, the charge leakage is restored only during tracking stage 328 rather than statically as by transistors 172, 174 in the prior art FIG. 1. Moreover, the charge leakage is restored only if the voltage on the lower-voltage bit line BL reaches the value VCC−|VTP|.

During sensing stage 329, signal SENSE is high. Transistor 252 turns on, starting regeneration. Transistors 430 and 432 are off. The regenerative effect pulls node 440 down to VSS. Node 442 is high keeping transistor 210 off. Inverters 470 and 472 invert the signals on respective nodes 440 and 442 providing complementary output signals on respective output leads 474 and 370.

The memory system of FIGS. 4 and 5 is fast and power efficient for the following reasons. Bit lines BL and $\overline{\text{BL}}$ are not charged statically, and hence static charging does not interfere with bit line differentiation during tracking. Further, because of the high read-disturb immunity, the equalizing transistors 331, 332 are off during the tracking stage and hence they also do not interfere with the bit line differentiation. Consequently, the memory speed and power efficiency are high. Furthermore, as explained above, turning the equalizing transistors off allows pulling the word line WL-A low during tracking period 328.2 which further improves the power efficiency and, moreover, increases the memory noise immunity. Pulling the word line WL-A low also increases the memory cycle rate as it increases the bit line precharge speed at the next reading operation.

Another reason for the high speed and high power efficiency is that, during tracking stage 328 and sensing stage 329, transistor 210 remains off and, therefore, transistor 210 does not interfere with pulling node 440 down and indeed by remaining off allows node 440 to be pulled down much faster than if transistor 210 was initially on.

Further, sense amplifier 360 has a high noise immunity because the noise generated by transistor switching is low in the tracking and sensing stages. More particularly, sense amplifier 360 does not include a transistor connecting the power supply voltage VCC to the sources of transistors 210, 212 such as transistor 250 in the prior art sense amplifier 200 of FIG. 3. The noise that would be generated by such a transistor is therefore eliminated. Further, transistor 210 does not switch states during tracking stage 328 and sensing stage 329. Moreover, if node 440 goes down below VCC−|VTP| at or before the end of tracking stage 328, transistor 212 turns on and does not switch states in sensing stage 329. The noise generated in sensing stage 329 is therefore low, and the noise immunity is high.

Further, the noise immunity, as well as the tolerance to temperature and process variations, can be increased simply by increasing the difference between the voltages on nodes 440, 442 reached by the end of tracking stage 328. The voltage difference can be increased simply by increasing the length of period 328.1. The voltage difference can be increased safely because of the high read-disturb immunity of the memory of FIG. 4 which is achieved by biasing bit lines BL and $\overline{\text{BL}}$ at voltage VCC rather than VCC/2 at the start of the reading operation as explained above. The voltage difference between nodes 440, 442 approaches VCC in some embodiments.

While the reading operation was illustrated above on the examples in which the memory cell pulls down bit line BL, the reading operation is similar when the memory cell pulls down bit line $\overline{\text{BL}}$.

High speed, high power efficiency, high noise immunity, high tolerance to temperature and process variations and the elimination of the VCC/2 bit line biasing which biasing in the prior art restricted the difference between the bit line voltages, make the memory and the sense amplifier of FIGS. 4, 5 suitable for low voltage power supply systems such as laptop, notebook, sub-notebook and hand-held computer systems with VCC between 2.7 V and 3.3 V. Some embodiments of sense amplifier 360 can operate at any VCC value between 2.7 V to 5.0 V. Moreover, in some embodiments, sense amplifier 360 can operate at any VCC value greater than VT where VT is the maximum of the absolute values of the threshold voltages of transistors 210, 212, 214, and 216. VT=1.0 V in some such embodiments.

The memory and the sense amplifier of FIGS. 4, 5 are suitable for use in both synchronous integrated circuits such as CPUs (for example, in cache memories) and in asynchronous integrated circuits such as typical SRAM chips. In particular, the high noise immunity makes the memory and the sense amplifier suitable for integration with noisy circuits such as CPUs. In the asynchronous circuits such as typical SRAM chips, signals $\overline{\text{PRECH}}$, $\overline{\text{PRECHSA}}$, and SENSE are generated from input control signals such as chip enable ($\overline{\text{CE}}$), write enable ($\overline{\text{WE}}$), output enable ($\overline{\text{OE}}$), address change detection circuitry, or other input control signals, using techniques known in the art.

While the invention has been described with respect to the embodiments set forth above, other embodiments and variations not described herein are within the scope of the invention. For example, the invention is not limited by any specific values of VCC and VSS. Further, in some embodiments, the bit lines are precharged to a value below VCC during the precharge stage. For example, in some embodiments, the bit lines are biased at 0.9 × VCC when VSS=0.0 V, and the threshold voltages of transistors 210 and 212 are such that transistors 210 and 212 are off during at least the beginning of the tracking stage and one of transistors 210, 212 is off during the entire tracking and sensing stages. In some embodiments, one of the pull-down transistors 214, 216 is off during the tracking and sensing stages so as not to interfere with keeping high the respective node 440 or 442. In some embodiments, the word line corresponding to the memory cell being read is high through the entire tracking stage. Other embodiments and variations not described herein are within the scope of the invention, as defined by the following claims.

What is claimed is:

1. A method of reading a memory cell, comprising the steps of:
   precharging complementary bit lines B1 and B2 to a predetermined voltage;
   tracking two complementary voltages, which represent a state of said memory cell, by said bit lines B1 and B2 so that said bit line B1 tracks one of said two voltages and said bit line B2 tracks the other one of said two voltages, wherein each of said two voltages is between predetermined values V1 and V2;
   tracking voltages on said bit lines B1 and B2 by a sense amplifier, wherein said step of tracking two complementary voltages by the bit lines terminates before this step of tracking of voltages on said bit lines by said sense amplifier terminates;
   if, during said step of tracking bit line voltages by said sense amplifier, the voltage on said bit line B1 is closer to said value V1 than a predetermined amount, then pulling the voltage on said bit line B2 towards said value V2; and
   if, during said step of tracking bit line voltages by said sense amplifier, the voltage on said bit line B2 is closer to said value V1 than said predetermined amount, then pulling the voltage on said bit line B1 towards said value V2.

2. A memory comprising:
   one or more columns of memory cells;
   one or more bit lines for tracking voltages indicative of states of said memory cells;
   one or more word lines for connecting memory cells to respective bit lines;
   a sense amplifier for amplifying voltages on said bit lines, said sense amplifier having, in every read operation, a tracking stage during which said sense amplifier tracks voltages on one or more bit lines; and
   means for asserting, during a read operation, a word line to allow one or more selected bit lines to track one or more voltages indicative of the state of a selected memory cell, said means deasserting the asserted word line before the end of the amplifier tracking stage of said read operation so as to isolate the bit lines from the memory cells before the end of the amplifier tracking stage.

3. The memory of claim 2 wherein:
   during said tracking stage, said amplifier is connected to one or more bit lines but is disabled from amplifying voltages on said bit lines; and
   said amplifier has a sensing stage following the tracking stage, for amplifying the voltages received from one or more selected bit lines, wherein during said sensing stage said amplifier is disconnected from said bit lines.

4. The memory of claim 2 further comprising means for precharging said bit lines to a predetermined voltage at the start of every read operation,
   wherein said means deasserting of a word line before the end of the amplifier tracking stage reduced a bit line voltage swing during the tracking stage thereby; (1) saving power during the next precharge by said precharging means, and (2) increasing the speed of the next precharge.

5. The memory of claim 2 wherein said means deasserting of a word line before the end of the tracking stage isolates the memory cells from any noise on the bit lines thereby improving the memory noise immunity.

6. The memory of claim 2 further comprising means for precharging the bit lines to a predetermined voltage before each tracking stage and equalizing the bit line voltages before each tracking state,
   wherein said means for precharging the equalizing is turned off during each tracking stage.

7. The memory of claim 2, said memory comprising two complementary bit lines for each column of memory cells, wherein said sense amplifier is for amplifying a differential voltage on two complementary bit lines.

8. A method of reading a memory having one or more columns of memory cells, said method comprising the steps of:
   asserting a word line to connect a selected memory cell to one or more bit lines, and tracking by said one or more bit lines a state of said selected memory cell;
   during at least a part of said asserting and tracking step, tracking voltages on said one or more bit lines by a sense amplifier;
   deasserting said word line to disconnect said one or more bit lines from said selected memory cell;

after deasserting said word line, continuing to track said voltages on said one or more bit lines by said sense amplifier; and disconnecting said one or more bit lines from said sense amplifier and amplifying voltages received by said sense amplifier from said one or more bit lines.

9. The method of claim 8 further comprising, before said step of asserting a word line, the step of precharging said bit lines to a predetermined voltage, wherein said deasserting of said word line while continuing to track the bit line voltages by said sense amplifier reduces the voltage swing on said one or more bit lines thereby saving power during a precharging step of the next read operation and increasing the precharging speed.

10. The method of claim 8 wherein said deasserting of said word line while continuing to track the bit line voltages by said sense amplifier isolates the selected memory cell from any noise on said one or more bit lines.

11. The method of claim 8 wherein said one or more bit lines comprise two complementary bit lines.

* * * * *